United States Patent
Koyata et al.

(10) Patent No.: US 6,597,229 B1
(45) Date of Patent: Jul. 22, 2003

(54) INTERFACE CIRCUIT AND, ELECTRONIC DEVICE AND COMMUNICATION SYSTEM PROVIDED WITH SAME

(75) Inventors: Koh Koyata, Tokyo (JP); Masayuki Yamaguchi, Tokyo (JP); Katsumi Abe, Tokyo (JP); Akimitsu Tajima, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/638,890

(22) Filed: Aug. 16, 2000

(30) Foreign Application Priority Data

Aug. 16, 1999 (JP) .............................. 11-229660

(51) Int. Cl.[7] ................................. H03L 5/00
(52) U.S. Cl. ............................. 327/333; 326/62; 326/68
(58) Field of Search ................................. 327/333, 108, 327/112; 326/62, 63, 68, 82, 83, 23, 30, 86

(56) References Cited

U.S. PATENT DOCUMENTS

| | | | | |
|---|---|---|---|---|
| 5,013,937 A | * | 5/1991 | Aoki ........................... 326/121 |
| 5,111,080 A | * | 5/1992 | Mizukami et al. ............. 326/30 |
| 5,153,451 A | * | 10/1992 | Yamamura et al. .......... 327/333 |
| 5,519,728 A | * | 5/1996 | Kuo .............................. 326/86 |
| 5,717,345 A | * | 2/1998 | Yokomizo et al. ............. 326/30 |
| 5,907,251 A | * | 5/1999 | Houghton ...................... 326/26 |
| 5,959,472 A | * | 9/1999 | Nagamatsu et al. ........... 326/83 |
| 5,969,554 A | * | 10/1999 | Chan et al. .................. 327/333 |
| 6,064,227 A | * | 5/2000 | Saito ............................ 326/68 |
| 6,066,975 A | * | 5/2000 | Matano ....................... 327/333 |
| 6,087,880 A | * | 7/2000 | Takagi ........................ 327/333 |
| 6,091,351 A | * | 7/2000 | Shimomura ................... 326/68 |
| 6,099,100 A | * | 8/2000 | Lee .............................. 326/81 |

FOREIGN PATENT DOCUMENTS

| | | |
|---|---|---|
| JP | 55-105840 | 8/1980 |
| JP | 3-045045 | 2/1991 |
| JP | 4-301920 | 10/1992 |
| JP | 5-160707 | 6/1993 |
| JP | 7-264042 | 10/1995 |
| JP | 7-307661 | 11/1995 |
| JP | 8-255487 | 10/1996 |
| JP | 9-171694 | 6/1997 |
| JP | 10-327066 | 12/1998 |

* cited by examiner

Primary Examiner—Tuan T. Lam
(74) Attorney, Agent, or Firm—McGinn & Gibb, PLLC

(57) ABSTRACT

An interface circuit includes a signal sending section having a first MOS transistor and a second MOS transistor which are alternately turned ON in accordance with a binary input signal. A signal receiving section has a third MOS transistor connected through a first signal transmission path to the first MOS transistor mounted in the signal sending section to feed a current with a predetermined value through the first signal transmission path when the first MOS transistor mounted in the signal sending section is turned ON. A fourth MOS transistor connected through a second signal transmission path to the second MOS transistor mounted in the signal sending section feeds a current with a predetermined value to the second signal transmission path when the second MOS transistor mounted in the signal sending section is turned ON.

19 Claims, 8 Drawing Sheets

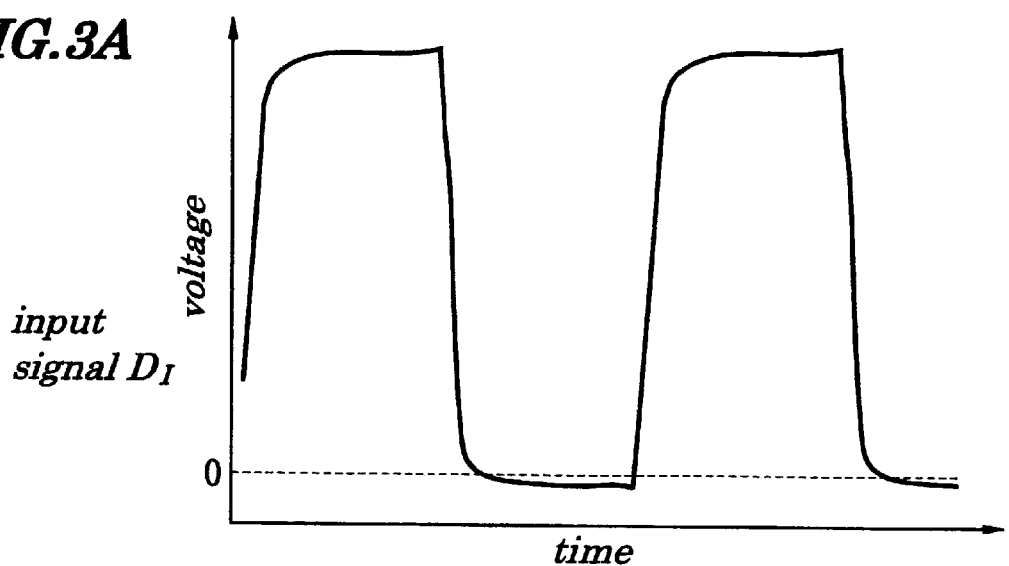
FIG. 3A input signal $D_I$
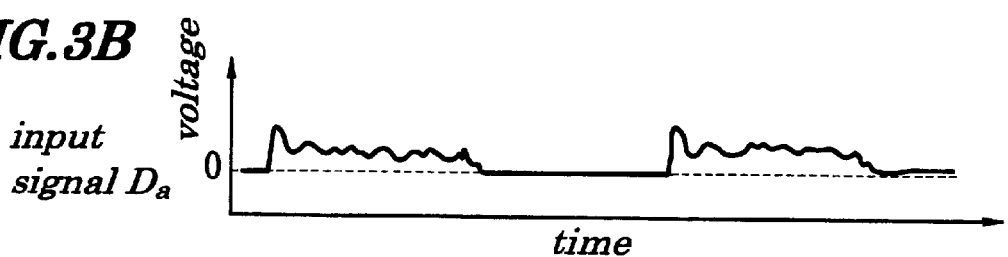
FIG. 3B input signal $D_a$
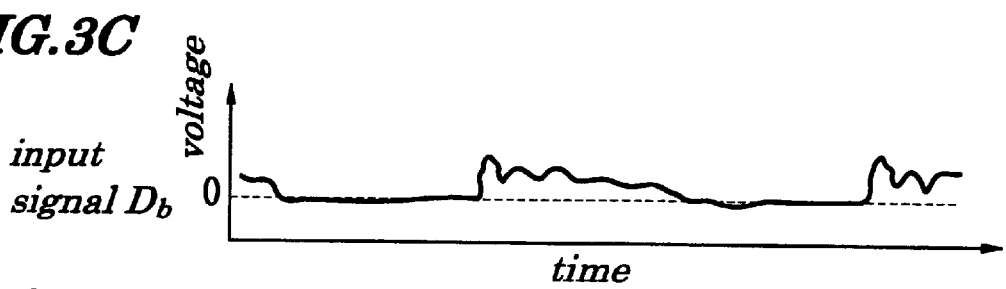
FIG. 3C input signal $D_b$
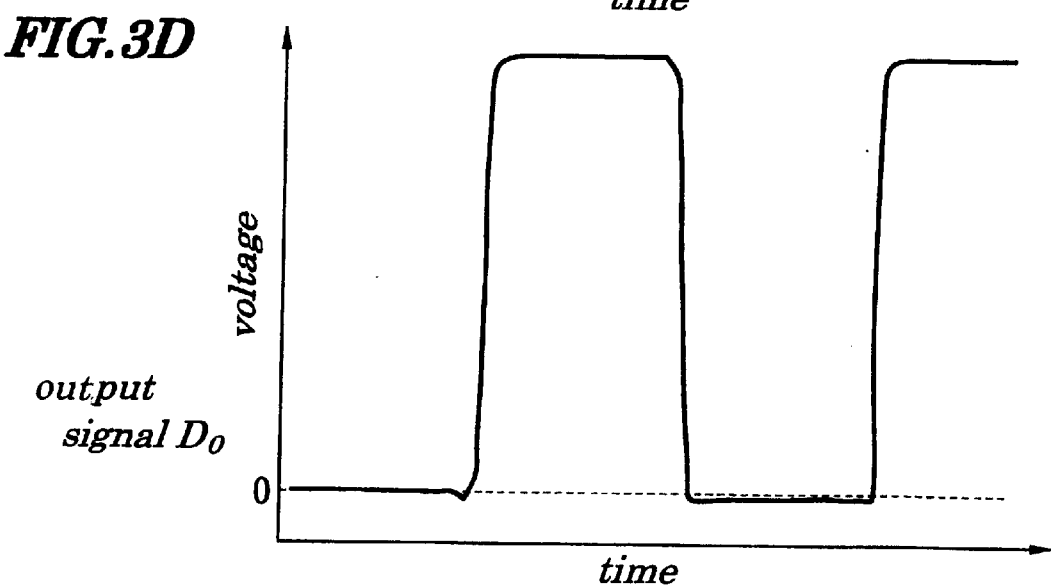
FIG. 3D output signal $D_O$ input signal $D_I$ input signal $D_a$ input signal $D_b$ input signal $D_O$

INTERFACE CIRCUIT AND, ELECTRONIC DEVICE AND COMMUNICATION SYSTEM PROVIDED WITH SAME

BACKGROUND OF THE INVENTION

1. Field of the Invention

The present invention relates to an interface circuit, and an electronic device and a communication system each being provided with the interface circuit and more particularly to the interface circuit using a current as a means for transmitting signals, and the electronic device and the communication system each being provided with the above interface circuit.

2. Description of the Related Art

Recently, as operations of a CPU (Central Processing Unit), semiconductor integrated circuit or like forming electronic devices and/or communication devices are sped up and mass processing of signals by the CPU or the like is made available, a demand for transmitting signals with high quality at high speed through a signal transmission path among circuits forming such electronic devices or among electronic devices is increasing.

When a signal is transmitted through the signal transmission path among circuits forming electronic devices or among electronic devices, a voltage whose amplitude changes between a power source and ground is conventionally used for transmitting signals. However, if the signal is transmitted at high speed through the signal transmission path, the signal transmission path cannot be treated as a concentrated constant circuit and has to be treated as a distributed constant circuit in which an inductive component and capacitive component are thought to be uniformly distributed.

Therefore, if voltage is used as the means for transmitting signals through the signal transmission path as in conventional technologies, since the capacitive component (parasitic capacitor) in the signal transmission path is charged and discharged depending on changes in the voltage and time is required for charging and discharging the capacitive component, resulting in a delay in rise time and fall time of signals, there is a limit to high-speed transmission of signals so long as the voltage is used as the means for transmitting signals. Moreover, since mutual interference occurs among the signal transmission paths and quality of the signal is degraded due to influences of external noise, it is impossible to transmit the signal with high quality. Furthermore, if grounding is strengthened to reduce the external noise or if a width of the signal transmission path is extended, number of the signal transmission paths is increased accordingly and routing of the signal transmission path is made difficult. Since the capacitive component of the signal transmission path is charged and discharged depending on changes in the voltage, a high-frequency noise occurs which causes an EMI (Electro-Magnetic Interference) with other electronic devices.

To solve problems of such inconvenience occurring when the voltage is used as the means for transmitting signals, an interface circuit using a current as the means for transmitting signals is proposed. To implement this, a technology called an LVDS (Low Voltage Differential Signaling) is introduced. In the LVDS technology, a constant current source provided in the signal sending section is activated.by two kinds of voltages which are in reverse phase of each other and change with an amplitude being about one-tenth smaller than that of the supply power source in order to feed a differential current through two signal transmission paths and a change in the differential current flowing through a terminating resistor of about 100 ☐ mounted in the signal receiving section is detected as a change of the voltage. An interface circuit having such configurations is disclosed in Japanese Patent Application Laid-open No. Hei7-264042 which is shown in FIG. 11. This interface circuit is chiefly composed of a signal sending section 3 constituting a semiconductor integrated circuit 1 and of a signal receiving section 4 constituting a semiconductor integrated circuit 2. The signal sending section 3 and the signal receiving section 4 are connected through signal transmission paths 5a and 5b formed on a printed circuit board.

The signal sending section 3 is mainly composed of transistors 6a, 6b, 7 and 8, constant current sources 9 and 10 and load resistors 11a and 11b. The transistors 6a and 6b, between which a differential connection is established, constitute a signal sending buffer. A constant current having a predetermined value fed from the constant.current source 9 is applied to these transistors 6a and 6b. To the gate of the transistor 6b is supplied a reference voltage $V_{REF}$. When a binary input signal $D_I$ is applied to the gate of the transistor 6a, each of the transistors 6a and 6b is turned ON alternately depending on the input binary signal $D_I$ and then output voltage is generated alternately across the load resistors 11a and 11b having a predetermined resistance. This causes transistors 7 and 8 constituting an analog switch to be turned ON alternately and a constant current having a predetermined value to flow through the signal transmission paths 5a and 5b from the constant current source 10.

The signal receiving section 4 is chiefly composed of amplifiers 12a and 12b, resistors 13a and 13b and a comparator 14. Each of the amplifier 12a and resistor 13a has an impedance matched to that of the signal transmission path 5a. The amplifier 12a and the resistor 13a constitute a trans-impedance circuit adapted to convert the current flowing through the signal transmission path 5ato a voltage. Each of the amplifier 12b and the resistor 13b has an impedance matched to that of the signal transmission path 5b. The amplifier 12b and the resistor 13b also constitute a trans-impedance circuit adapted to convert the current flowing through the signal transmission path 5b to a voltage. When the constant current having the predetermined value flows alternately through the signal transmission paths 5a and 5b, since a voltage having a predetermined value is alternately generated in the amplifier 12a and 12b, the comparator 14 identifies the generated voltage and outputs it as a regenerative signal $D_P$.

In the conventional interface circuit described above, since the constant current source is provided in the signal sending section in any case, if two or more signal receiving sections receive, in parallel, a signal sent from one signal sending section to try to reduce number of the transmission paths, an amplitude of the voltage varies depending on number of signal receiving sections. This is because impedance cannot be matched due to increase and decrease in number of signal receiving sections. Therefore, unless number of the signal receiving sections is determined, the constant current source to be mounted in the signal sending section cannot be designed. Thus, the conventional interface circuit has a shortcoming in that it provides limited versatility and it cannot respond flexibly to changes in state occurring after the installation of the device. In the conventional interface circuit disclosed in the Patent Application described above in particular, since it has the trans-impedance circuit having complicated configurations, changes in designing the signal receiving section are required every time number of the signal receiving sections is changed, which therefore provides further disadvantage. Moreover, in the conventional interface circuit described above, in any case, since a current has to be fed at all times when the signal is transmitted a large reduction of power consumption is not expected.

Moreover, the conventional interface circuit has another shortcoming in that, since the trans-impedance circuit, comparator or a like has complicated configurations, it causes a large-scaled circuit and largely occupied area if the interface circuit is incorporated into the semiconductor integrated circuit or a like.

SUMMARY OF THE INVENTION

In view of the above, it is an object of the present invention to provide an interface circuit having a simplified circuit configuration capable of transmitting a signal with high quality at high speed, of decreasing its power consumption and EMI and of reducing number of signal transmission paths, and an electronic device and a communication system each being provided with the above interface circuit.

According to a first aspect of the present invention, there is provided an interface circuit including:

a signal sending circuit having a first switching means and a second switching means which are alternately turned ON in accordance with a binary input signal;

a signal receiving circuit having a first current supplying circuit connected through a first signal transmission path to the first switching means and operated to feed a current with a predetermined value to the first signal transmission path when the first switching means is turned ON and a second current supplying circuit connected through a second signal transmission path to the second switching means and operated to feed a current with a predetermined value to the second signal transmission path when the second switching means is turned ON; and whereby the signal receiving circuit detects a change in voltages generated depending on availability of current supply at the first and second current supplying circuits and outputs it in the form of a binary output signal.

In the foregoing, a preferable mode is one wherein the signal receiving circuit has a first potential holding means for holding a potential at a connection point between the first current supplying circuit and the first signal transmission path to a predetermined level when the first switching means is turned OFF and a second potential holding means for holding a potential at a connection point between the second current supplying circuit and the second signal transmission path to a predetermined level when the second switching means is turned OFF.

Also, a preferable mode is one wherein the signal sending circuit has an output stopping means to turn OFF both the first switching means and second switching means.

Also, a preferable mode is one wherein the first and second switching means, first and second current supplying circuits and first potential holding means are composed of transistors.

Also, a preferable mode is one wherein at least the first and second current supplying circuits are composed of bipolar transistors.

Furthermore, a preferable mode is one wherein the first current supplying circuit is composed of first and second transistors a size of each being one half that of the transistor used for current supplying circuit composed of only one transistor and each being equal in size and the second current supplying circuit is composed of third and fourth transistors a size of each being one half that of the transistor used for current supplying circuit composed of only one transistor and each being equal in size and wherein circuit configurations seen from a connection point between the first current supplying circuit and the first signal transmission path and those seen from a connection point between the second current supplying circuit and the second transmission path are symmetric.

According to a second aspect of the present invention, there is provided an electronic device provided with the interface circuit described above.

According to a third aspect of the present invention, there is provided an electronic device provided with a circuit having the signal sending circuit described above and with at least one circuit having the signal receiving circuit described above.

According to a fourth aspect of the present invention, there is provided an electronic device provided with at least one circuit having the signal sending circuit described above and with at least one circuit having the signal receiving circuit described above.

According to a fifth aspect of the present invention, there is provided a communication system provided with an electronic device having the signal sending circuit described above and at least one electronic device having the signal receiving circuit described above.

According to a sixth aspect of the present invention, there is provided a communication system provided with at least one electronic device having the signal sending circuit described above and with at least one electronic device having the signal receiving circuit described above.

BRIEF DESCRIPTION OF THE DRAWINGS

The above and other objects, advantages and features of the present invention will be more apparent from the following description taken in conjunction with the accompanying drawings in which:

FIGS. 3A to 3D are diagrams of waveforms explaining operations of the interface circuit of FIG. 1;

DETAILED DESCRIPTION OF THE PREFERRED EMBODIMENTS

Best modes of carrying out the present invention will be described in further detail using various embodiments with reference to the accompanying drawings.

First Embodiment

Figure 1:
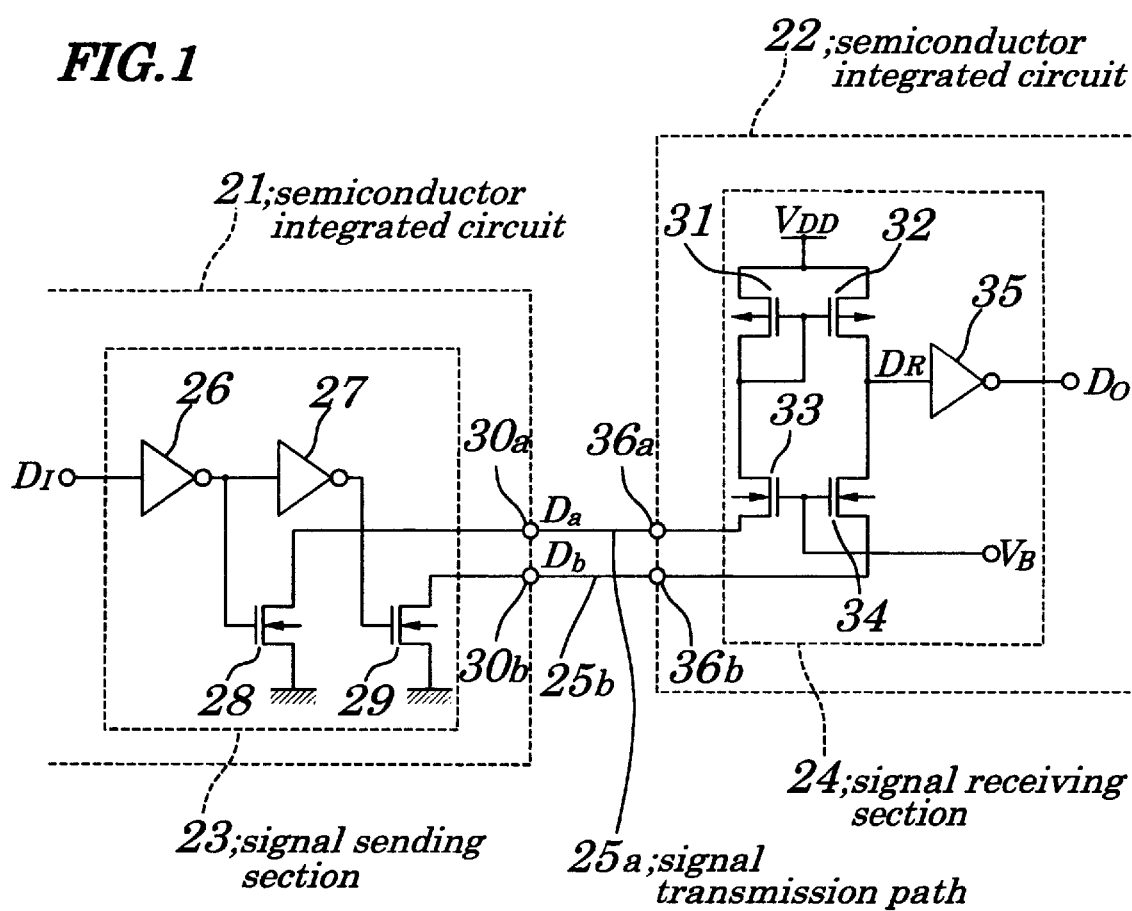
FIG. 1 is a schematic circuit diagram showing electrical configurations of an interface circuit according to a first embodiment of the present invention.

FIG. 1 is a schematic circuit diagram showing electrical configurations of an interface circuit according to a first embodiment of the present invention. The interface circuit of this embodiment is chiefly made of a semiconductor integrated circuit 21 forming a signal sending section 23 and of a semiconductor integrated circuit 22 forming a signal receiving section 24. The signal sending section 23 and signal receiving section 24 are connected through signal transmission paths 25a and 25b formed on a printed circuit board.

The signal sending section 23 is mainly formed of inverters 26 and 27 and open-drain type N-channel MOS transistors 28 and 29. The inverter 26 inverts a binary input signal $D_I$ and outputs an inverted signal. The inverter 27 inverts signal output from the inverter 26 and outputs it. The gate of the MOS transistor 28 is connected to an output terminal of the inverter 26. Its source is grounded and its drain is connected to an output terminal 30a of the semiconductor integrated circuit 21. When the MOS transistor 28 is turned ON by the signal outputted from the inverter 26, a current supplied from the signal receiving section 24 through the signal transmission path 25a is passed to a ground. The gate of the MOS transistor 29 is connected to an output terminal of the inverter 27. Its source is grounded and its drain is connected to an output terminal 30b of the semiconductor integrated circuit 21. When the MOS transistor 29 is turned ON by the signal outputted from the inverter 27, the current supplied from the signal sending section 23 through the signal transmission path 25b is passed to a ground.

The signal receiving section 24 is chiefly made of P-channel MOS transistors 31 and 32, N-channel MOS transistors 33 and 34 and an inverter 35. The source of the MOS transistor 31 is connected to that of the MOS transistor 32 through the connection point of which a supply voltage $V_{DD}$ is applied. The gate of the MOS transistor 31 is connected to that of the MOS transistor 32, the connection point of which is connected to the drain of the MOS transistor 31. The gate and drain of the MOS transistor 31 are connected to the drain of the MOS transistor 33. The drain of the MOS transistor 32 is connected to an input terminal of the inverter 35 and to the drain of the MOS transistor 34. The gate of the MOS transistor 33 is connected to that of the MOS transistor 34 through the connection point of which a bias voltage $V_B$ being fixed to a predetermined value is applied, forming a gate grounding circuit. The source of the MOS transistor 33 is connected to an input terminal 36a of the semiconductor integrated circuit 22 and the source of the MOS transistor 34 is connected to an input terminal 36b of the semiconductor integrated circuit 22.

Figure 2:
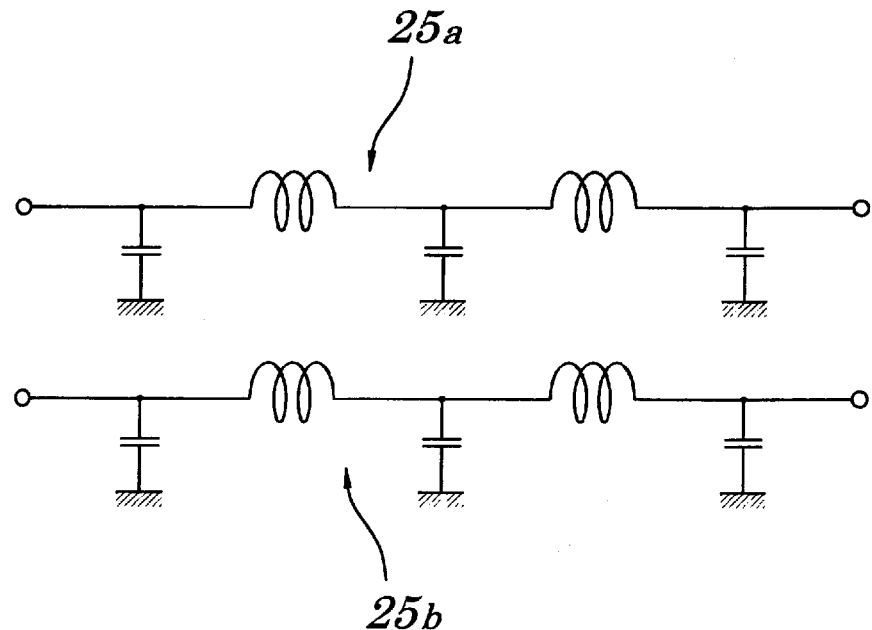
FIG. 2 is a schematic circuit diagram showing one example of configurations of an equivalent circuit of a signal transmission path according to the first embodiment.

Next, operations of an interface circuit described above will be described hereinafter by providing an equivalent circuit of the signal transmission paths 25a and 25b in a form of a simplified distributed constant circuit as shown in FIG. 2 and by assuming that the input signal $D_I$ has a waveform as shown in FIG. 3A.

When the input signal $D_I$ rises to an "H" level, since an output signal from the inverter 26 falls to an "L" level, the MOS transistor 28 is turned OFF. This causes a voltage $D_a$ at the output terminal 30a of the semiconductor integrated circuit 21, that is, a drain voltage of the MOS transistor 28 to be slightly higher than 0 (zero) volts as shown in FIG. 3B, thus resulting in almost no flow of current which otherwise would flow from a power source of the signal receiving section 24 through the MOS transistors 31 and 33 and through the signal transmission path 25a and the MOS transistor 28 to the ground.

When the output signal from the inverter 26 falls to an "L" level, since an output signal from the inverter 27 rises to the "H" level, the MOS transistor 29 is turned ON. This causes a voltage $D_b$ at the output terminal 30b of the semiconductor integrated circuit 21, that is, a drain voltage of the MOS transistor 28 to become almost 0 (zero) volts as shown in FIG. 3C, thus resulting in flow of a current having a predetermined value which flows from a power source of the signal receiving section 24 through the MOS transistors 32 and 34 and through the signal transmission path 25b and the MOS transistor 29 to the ground. Therefore, since the voltage $D_R$ at a connection point between the drain of the MOS transistor 32 and the drain of the MOS transistor 34, that is, a voltage at an input terminal of the inverter 35 becomes almost 0 (zero) volts, an output signal $D_O$ of the inverter 35 rises to the "H" level with delay of a predetermined period of time, as shown in FIG. 3D.

Next, when the input signal $D_I$ falls to the "L" level, since the output signal from the inverter 26 rises to the "H" level, the MOS transistor 28 is turned ON. This causes the voltage $D_a$ at the output terminal 30a of the semiconductor integrated circuit 21, that is, a drain voltage of the MOS transistor 28 to become almost 0 (zero) volts as shown in FIG. 3C, thus resulting in flow of a current having a predetermined value which flows from the power source of the signal receiving section 24 through the MOS transistors 31 and 33 and through the signal transmission path 25a and the MOS transistor 28 to the ground.

When output signal from the inverter 26 rises to the "H" level, since an output signal from the inverter 27 falls to the "L" level, the MOS transistor 29 is turned OFF. This causes the voltage $D_b$ at the output terminal 30b of the semiconductor integrated circuit 21, that is a drain voltage of the MOS transistor 29 to be slightly higher than 0 (zero) volts as shown in FIG. 3C, thus resulting in almost no flow of current which otherwise would flow from the power source of the signal receiving section 24 through the MOS transistors 32 and 34 and through the signal transmission path 25b and the MOS transistor 29 to the ground. Therefore, since the voltage $D_R$ at the connection point between the drain of the MOS transistor 32 and the drain of the MOS transistor 34, that is, a voltage at the input terminal of the inverter 35 becomes almost equal to the supply voltage $V_{DD}$, the output signal $D_O$ of the inverter 35 falls to the "L" level with the delay of a predetermined period of time, as shown in FIG. 3D.

Figure 4:
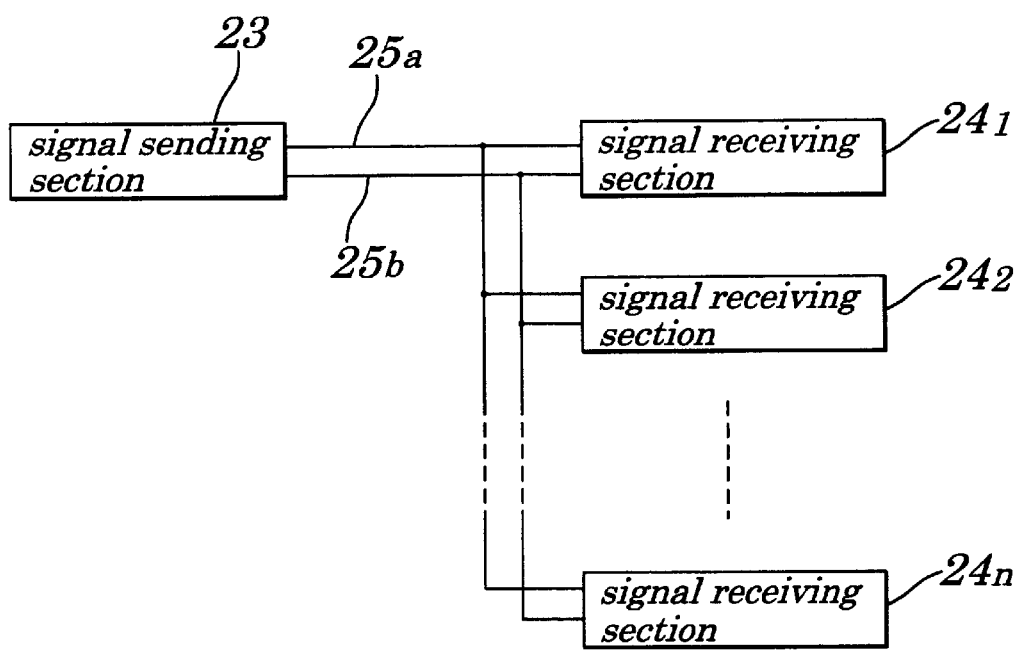
FIG. 4 is a schematic block diagram showing one example of applications of the interface circuit of FIG. 1.

Thus, according to this embodiment, the signal sending section 23 is provided with the MOS transistors 28 and 29 each functioning as a switching circuit and, unlike in a case of the conventional technology, it is not provided with a constant current source. The signal receiving section 24 is provided with the MOS transistors 31 and 32 each having a same function as the constant current source. As a result, as shown in FIG. 4, even if a signal to be transmitted from one signal sending section 23 is received, in parallel, by n-pieces of signal receiving sections $24_1$ to $24_n$ ("n" is an integer) to reduce number of the signal transmission paths, the signal sending section 23 can be designed freely regardless of number of the signal receiving sections. This also allows the interface circuit to provide great versatility and to be responded flexibly to changes in a state occurring after the installation of the electronic device.

Moreover, according to this embodiment, while signal is transmitted, since only either of the MOS transistors 28 or 29 is turned ON, causing current to flow through only either of the signal transmission paths 25a or 25b, power consumption can be greatly reduced accordingly.

Furthermore, according to this embodiment, as is apparent from FIG. 1, since the interface circuit is so constructed as to have very simplified circuit configurations, it does not occupy so much area when being integrated into the semiconductor integrated circuit. Also, as is apparent from FIG. 1, since only power which can activate three MOS transistors connected serially is required, the interface circuit can be operated by a supply power of only about 1.5 volts.

Second Embodiment

Figure 5:
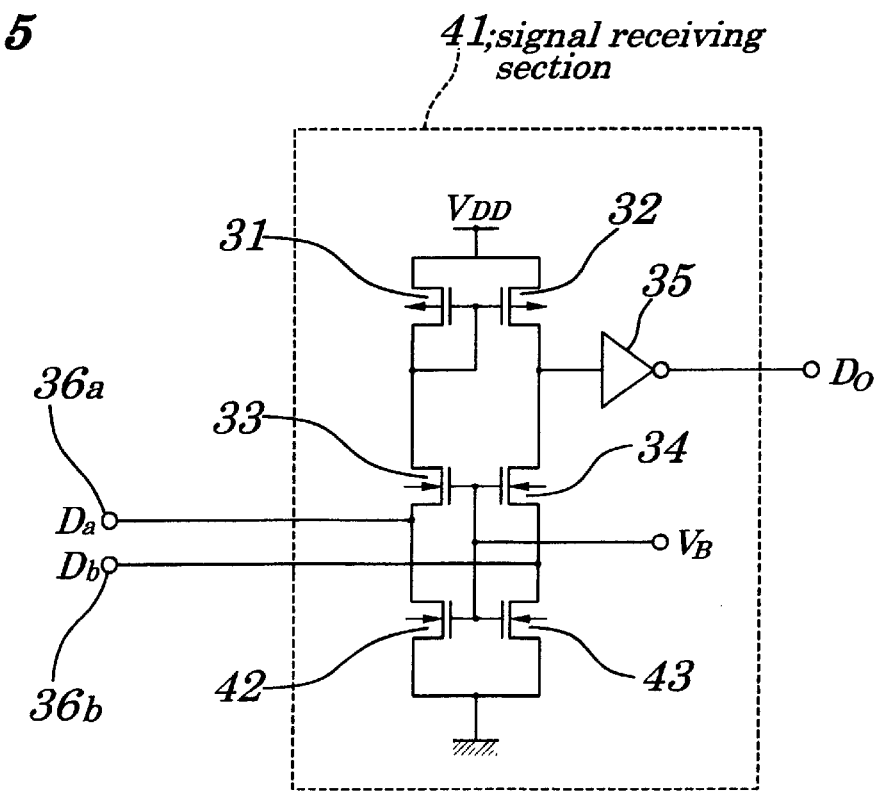
FIG. 5 is a schematic circuit diagram showing electrical configurations of a signal receiving section forming an interface circuit according to a second embodiment of the present invention.

FIG. 5 is a schematic circuit diagram showing electrical configurations of a signal receiving section 41 forming an interface circuit according to a second embodiment of the present invention. In FIG. 5, each of parts corresponding to that in FIG. 1 is assigned a same reference number and its description is omitted accordingly. As shown in FIG. 5, N-channel MOS transistors 42 and 43 are newly provided in the interface circuit of this embodiment. In addition, configurations and operations of a signal sending section and connections between the signal receiving section 41 and signal sending section through same signal transmission paths as those of signal sending section 23 and connections between signal receiving section 24 and the signal sending section 23 through signal transmission paths 25a and 25b and therefore their descriptions are omitted.

The gate of the MOS transistor 42 is connected to that of the MOS transistor 43 through its connection point of which a bias voltage $V_B$ is applied and both sources of the MOS transistors 42 and 43 are grounded. The drain of the MOS transistor 42 is connected to the source of MOS transistor 33. The drain of the MOS transistor 43 is connected to the source of MOS transistor 34.

The MOS transistor 42 is so constructed that a source voltage of the MOS transistor 33, that is, voltage $D_a$ at input terminal 36a is fixed to a predetermined value even when MOS transistor 28 is OFF, which forms the signal sending section 23 and is connected through the signal transmission path 25a to the source of the MOS transistor 33, by feeding a current being equivalent to, for example, about 10% to 25% of the current that would flow through the MOS transistor 33 when the MOS transistor 28 is turned ON, to the MOS transistor 33. Similarly, the MOS transistor 43 is so constructed that a source voltage of the MOS transistor 34, that is, voltage $D_b$ at the input terminal 36b is fixed to a predetermined value even when the MOS transistor 29 is OFF, which forms the signal sending section 23 and is connected through the signal transmission path 25b to the source of the MOS transistor 34, by feeding a current being equivalent to, for example, about 10% to 25% of the current that would flow through the MOS transistor 34 when the MOS transistor 29 is turned ON, to the MOS transistor 34.

Basic operations of the signal receiving section 41 forming the interface circuit of this embodiment are same as those of the signal receiving section 24 shown in FIG. 1 and their descriptions are omitted accordingly.

Thus, according to this embodiment, by mounting the MOS transistors 42 and 43, even when a switching circuit provided in the signal sending section is OFF, potentials of the signal transmission path and internal portions of the signal sending section are fixed to the predetermined value. Therefore, since operations of the signal transmission are more stable when compared with those in the first embodiment, the interface circuit can be more resistant to external noise. Moreover, when a signal is transmitted, source voltages of the MOS transistors 33 and 34 are changed immediately from the above predetermined value to about 0 (zero) volts, the signal can be received at higher speed compared with the case of the first embodiment.

Third Embodiment

Figure 6:
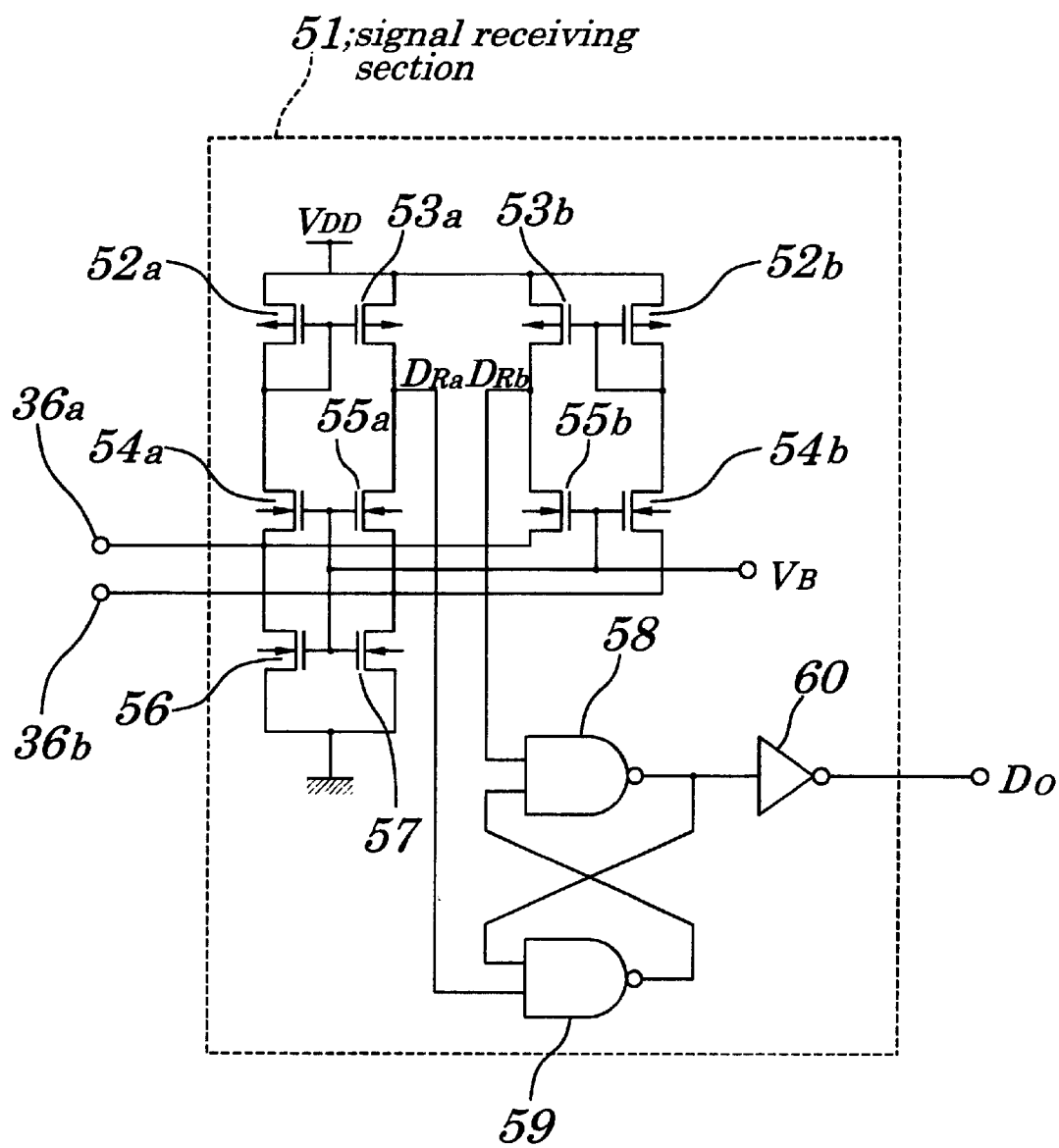
FIG. 6 is a schematic circuit diagram showing electrical configurations of a signal receiving section forming an interface circuit according to a third embodiment of the present invention.

FIG. 6 is a schematic circuit diagram showing electrical configurations of a signal receiving section 51 forming an interface circuit according to a third embodiment of the present invention. Configurations and operations of a signal sending section and connections between the signal receiving section 51 and signal sending section through signal transmission paths are same as those of signal sending section 23 shown in FIG. 1 and connections between signal receiving section 24 and the signal sending section 23 through signal transmission paths 25a and 25b and their descriptions are omitted accordingly.

The signal receiving section 51 of this embodiment chiefly includes P-channel MOS transistors 52a, 52b, 53a and 53b, N-channel MOS transistors 54a, 54b, 55a, 55b, 56 and 57, NAND gates 58 and 59 and an inverter 60.

Size of each of the MOS transistors 52a, 52b, 53a and 53b is about one-half that of each of MOS transistors 31 and 32. The source of the MOS transistor 52a is connected to that of the MOS transistor 53a through a connection point of which a supply voltage $V_{DD}$ is applied. The gate of the MOS transistor 52a is connected to that of the MOS transistor 53a, the connection point of which is connected to the drain of the MOS transistor 52a. The gate and drain of the MOS transistor 52a are connected to the drain of the MOS transistor 54a. The drain of the MOS transistor 53a is connected to that of the MOS transistor 55a and also to a second input terminal of the NAND gate 59. The gate of the MOS transistor 54a is connected to that of the MOS transistor 55a through the connection point of which a bias voltage $V_B$ being fixed to a predetermined value is applied, thereby forming a gate grounding circuit. The source of the MOS transistor 54a is connected to an input terminal 36a of semiconductor integrated circuit 22 and to the drain of the MOS transistor 56. The source of the MOS transistor 55a is connected to an input terminal 36b of the semiconductor integrated circuit 22 and to the drain of the MOS transistor 57.

The source of the MOS transistor 52b is connected to that of the MOS transistor 53b through the connection point of which a supply voltage $V_{DD}$ is applied. The gate of the MOS transistor 52b is connected to that of the MOS transistor 53b a connection point of which is connected to the drain of the MOS transistor 52b. The gate and drain of the MOS transistor 52b are connected to the drain of the MOS transistor 54b. The drain of the MOS transistor 53b is connected to that of the MOS transistor 55b and to a first input terminal of the NAND gate 58. The gate of the MOS transistor 54b is connected to that of the MOS transistor 55b through the connection point of which a bias voltage $V_B$ is applied, thereby forming the gate grounding circuit. The source of the MOS transistor 54b is connected to the input terminal 36b and to the drain of the MOS transistor 57. The source of the MOS transistor 55b is connected to the input terminal 36a and to the drain of the MOS transistor 56. Thus, circuit configurations seen from the input terminal 36a and those seen from the input terminal 36b are symmetric.

The gate of the MOS transistor 56 is connected to that of the MOS transistor 57 through the connection point of which the bias voltage $V_B$ is applied and each of the source of the MOS transistors 56 and 57 is grounded. The MOS transistor 56 is so constructed that source voltages of the MOS transistors 54a and 55b, that is, a voltage $D_a$ at the input terminal 36a are fixed to a predetermined value even when the MOS transistor 28 is OFF, which forms the signal sending section 23 and is connected through the signal transmission path 25a to the sources of the MOS transistors 54a and 55b, by feeding a current being equivalent to, for example, about 10% to 25% of total currents flowing through the MOS transistors 54a and 55b when MOS transistor 28 is turned ON, to the MOS transistors 54a and 55b. Similarly, the MOS transistor 57 is so constructed that source voltages of the MOS transistors 54b and 55a, that is, voltage $D_b$ at the input terminal 36a is fixed to a predetermined value even when MOS transistor 29 is OFF, which forms the signal sending section 23 and is connected through the signal transmission path 25a to the sources of the MOS transistors 54b and 55a, by feeding a current being equivalent to, for example, about 10% to 25% of total currents flowing through the MOS transistors 54b and 55a when the MOS transistor 29 is turned ON, to the MOS transistors 54b and 55a. The NAND gates 58 and 59 constitute an RS (Reset Set) flip flop. A voltage $D_{Ra}$ at a connection point between the drain of the MOS transistor 53a and the drain of the MOS transistor 55a is input to the NAND gate 59 and a voltage $D_{Rb}$ at a connection point between the drain of the MOS transistor 53b and the drain of the MOS transistor 55b is inputted to the NAND gate 58. The NAND gates 58 and 59 perform waveform shaping of these inputs and output them. The inverter 60 inverts output signals from the NAND gate 58 and outputs it as output signal $D_O$. Since the NAND gates 58 and 59 function as a waveform shaping circuit, they may not be mounted. Instead, for example, input terminal of the inverter 60 may be connected directly to the connection point between the drain of the MOS transistor 53a and the drain of the MOS transistor 55a. Basic configurations of the signal receiving section 51 forming the interface circuit of this embodiment are the same as those of the signal receiving section 41 shown in FIG. 5 and therefore their descriptions are omitted.

Thus, according to the embodiment, since circuit configurations seen from the input terminal 36a and those seen from the input terminal 36b are symmetric, operations performed when the MOS transistor 28 forming the switching circuit of the signal sending section is turned ON and operations performed when the MOS transistor 29 is turned ON are also symmetric. Therefore, operations of signal transmission are more stable when compared with those in the second embodiment. This allows signal to be transmitted at higher speed. For example, maximum frequency at which the output signal $D_O$ having a full amplitude is obtained at a time of the supply voltage $V_{DD}$ being 3.3 V is not more than 300 MHz in the circuit configuration in FIG. 1, 300 MHz in the circuit configuration in FIG. 5 and about 400 MHz in this embodiment. The maximum frequency at which the output signal $D_O$ having a full amplitude is obtained at the time of the supply voltage $V_{DD}$ being 3.3 V is not more than 350 Hz in a case where a signal is transmitted through the same signal transmission path as above by using an interface circuit based on the LVDS technology.

Moreover, according this embodiment, since size of each of the MOS transistors 52a, 52b, 53a and 53b is one-half that of each of MOS transistors 31 and 32, operation current decreases to one-half and, as in a case of the second embodiment, since the MOS transistors 56 and 57 are provided, it is needless to say that almost same effects as those of the second embodiment can be obtained.

Fourth Embodiment

Figure 7:
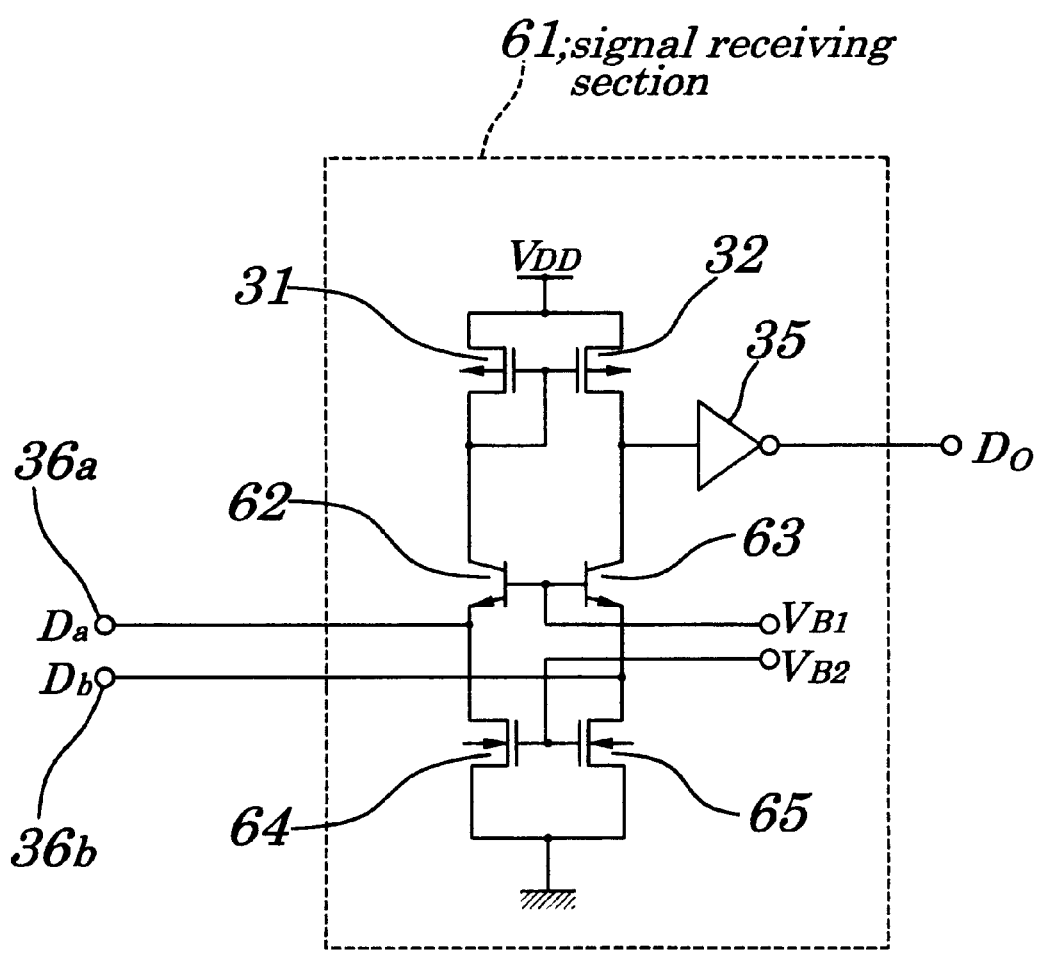
FIG. 7 is a schematic circuit diagram showing electrical configurations of a signal receiving section forming an interface circuit according to a fourth embodiment of the present invention.

FIG. 7 is a schematic circuit diagram showing electrical configurations of a signal receiving section 61 forming an interface circuit according to a fourth embodiment of the present invention. In FIG. 7, each of parts corresponding to that in FIG. 1 is assigned a same reference number and its description is omitted accordingly. The interface circuit of this embodiment is provided with NPN-type bipolar transistors 62 and 63 instead of N-channel MOS transistors 33 and 34 and with N-channel MOS transistor 64 and 65. Configurations and operations of a signal sending section and connections between the signal receiving section 61 and signal sending section through the signal transmission paths are same as those of signal sending section 23 shown in FIG. 1 and connections between signal receiving section 24 and the signal sending section 23 through signal transmission paths 25a and 25b and therefore their descriptions are omitted.

The base of the bipolar transistor 62 is connected to that of the bipolar transistor 63 through a connection point of which a bias voltage $V_{B1}$ being fixed to a predetermined value is applied, thereby forming a base grounding circuit. The collector of the bipolar transistor 62 is connected to the gate and drain of MOS transistor 31 and its emitter is connected to an input terminal 36a of semiconductor integrated circuit 22 and to the drain of the MOS transistor 64. The collector of the bipolar transistor 63 is connected to the drain of MOS transistor 32 and to an input terminal of inverter 35, and its emitter is connected to an input terminal 36b of the semiconductor integrated circuit 22 and to the drain of the MOS transistor 65.

Figure 8A:
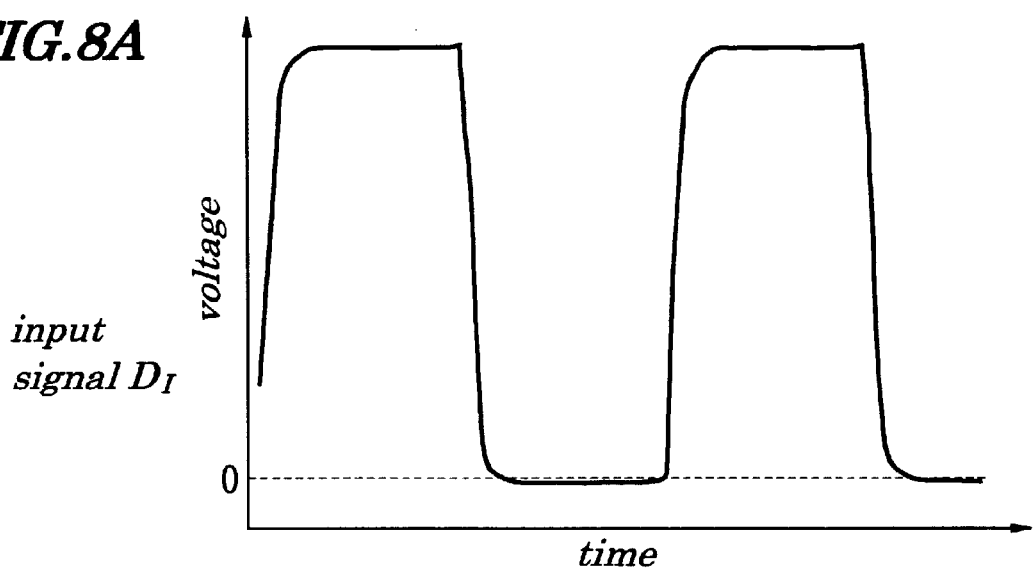
FIGS. 8A to 8D are diagrams of waveforms explaining operations of the interface circuit of FIG. 7.
Figure 8B:
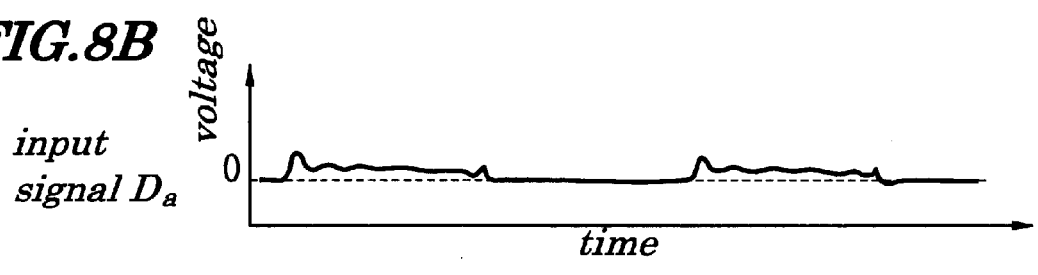
Figure 8C:
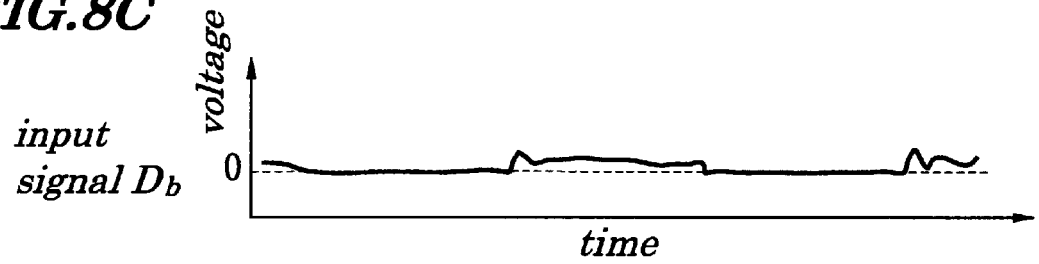
Figure 8D:
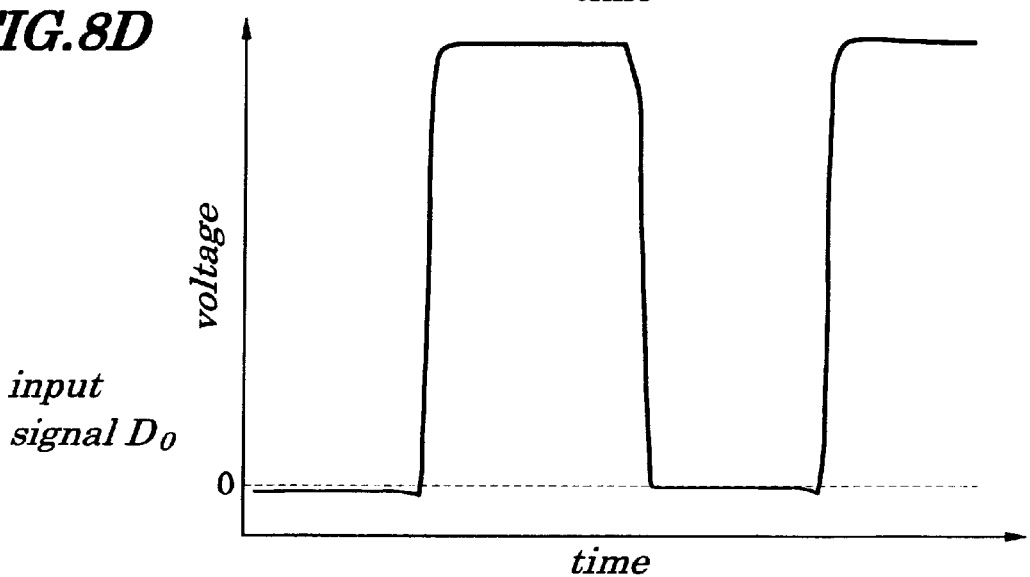

The base of the MOS transistor 64 is connected to that of the MOS transistor 65 through a connection point of which a bias voltage $V_{B2}$ is applied and both their sources are grounded. Functions of the MOS transistors 64 and 65 are almost same as those of the MOS transistors 42 and 43 of the above second embodiment and their descriptions are omitted accordingly. Moreover, basic operations of the signal receiving section 61 forming the interface circuit having the above configurations described by representing an equivalent circuit of the signal transmission paths 25a and 25b in a form of the simplified distributed constant circuit as shown in FIG. 2 and by assuming that input signal $D_I$ has a waveform as shown in FIG. 8A, are almost same as operations of the signal receiving section 24 shown in FIG. 1 and their descriptions are omitted accordingly. However, as is apparent from comparison of voltages between in FIG. 3B and FIG. 8B and between in FIG. 3C and FIG. 8C, voltages $D_a$ and $D_b$ for the signal transmission paths 36a and 36b in FIGS. 8B and 8C are smaller than those in FIGS. 3B and 3C. This is because, unlike in a gate grounding circuit including the MOS transistors 33 and 34 shown in FIG. 1, in a base grounding circuit including the bipolar transistors 62 and 63, impedance of the emitter is stable at a level being lower than that of the source. Moreover, since operation speed of the bipolar transistor is high, as the comparison of FIG. 3D with FIG. 8D shows, delay time of the output signal $D_O$ for the input signal $D_I$ is short. Therefore, according to this embodiment, speed of signal transmission can be made higher when compared with a case of the first embodiment.

In addition, since, unlike a case of the gate grounding circuit, in the base grounding circuit, impedance of the emitter is stable at a level being lower than that of the source, transmission operation of the signal in this embodiment is more stable than that in the second embodiment.

Thus, by using the bipolar transistors 62 and 63, an ideal current driving-type interface circuit can be implemented.

Fifth Embodiment

Figure 9:
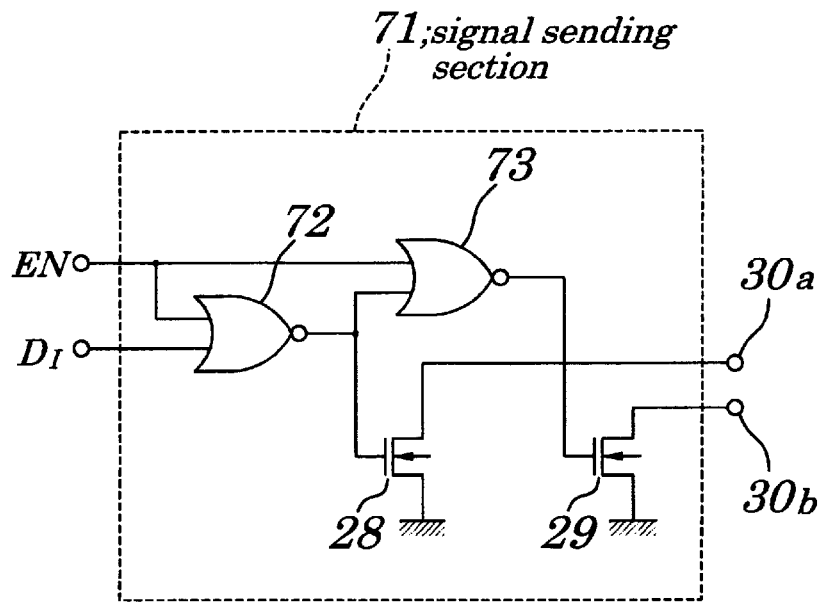
FIG. 9 is a schematic circuit diagram showing electrical configurations of a signal sending section forming an interface circuit according to a fifth embodiment of the present invention.

FIG. 9 is a schematic circuit diagram showing electrical configurations of a signal sending section 71 forming an interface circuit according to a fifth embodiment of the present invention. In FIG. 9, each of parts corresponding to that in FIG. 1 is assigned a same reference number and its description is omitted accordingly. In the interface circuit shown in FIG. 9, instead of inverters 26 and 27, NOR gates 72 and 73 are provided. Configurations and operations of a signal receiving section and connections between the signal sending section 71 and signal receiving section through signal transmission paths are same as those of the signal receiving section 24 shown in FIG. 1 and connections between the signal sending section 71 and the signal receiving section 24 through signal transmission paths 25a and 25b and therefore their descriptions are omitted.

In the NOR gate 72, an enable signal EN is input to a first input terminal and a binary input signal $D_I$ is input to a second input terminal and, when the enable signal EN is at an "L" level, the NOR gate 72 inverts the input signal $D_I$ and feeds it to the gate of MOS transistor 28. In the NOR gate 73, the enable signal EN is input to the first input terminal and output signal from the NOR gate 72 is input to the second input terminal and, when the enable signal EN is at the "L" level, the NOR gate 73 inverts the output signal from the NOR gate 72 and feeds it to the gate of the MOS transistor 29. In this case, basic operations of the signal sending section 71 are almost same as those of signal sending section 23 shown in FIG. 1 and therefore descriptions are omitted.

Figure 10:
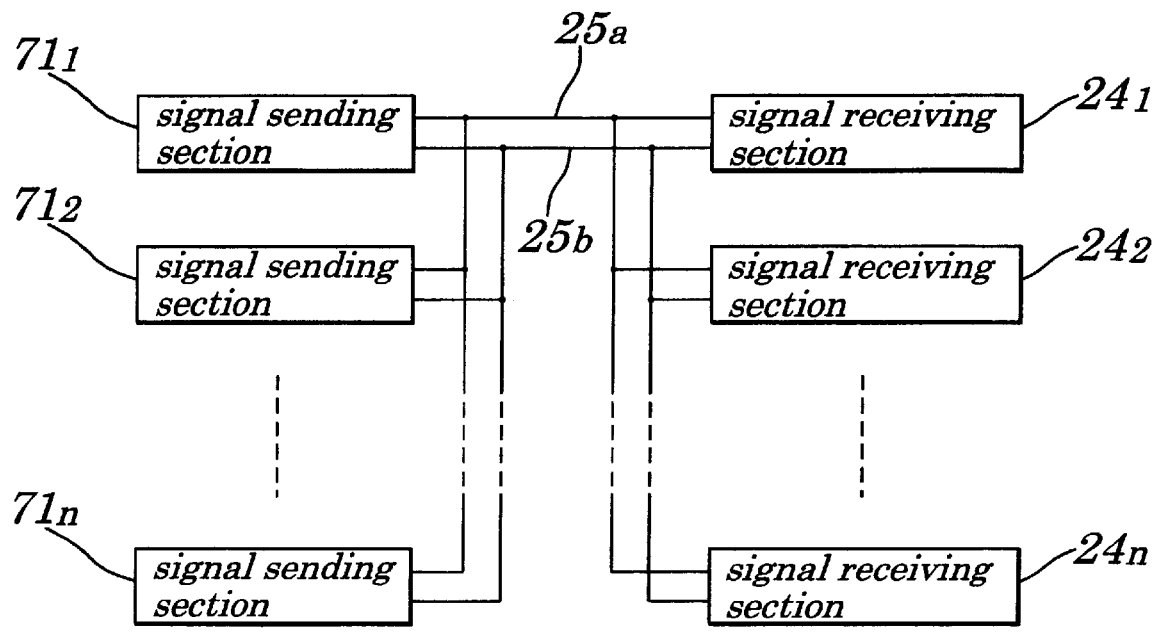
FIG. 10 is a schematic block diagram showing one example of the interface circuit of FIG. 9.
Figure 11:
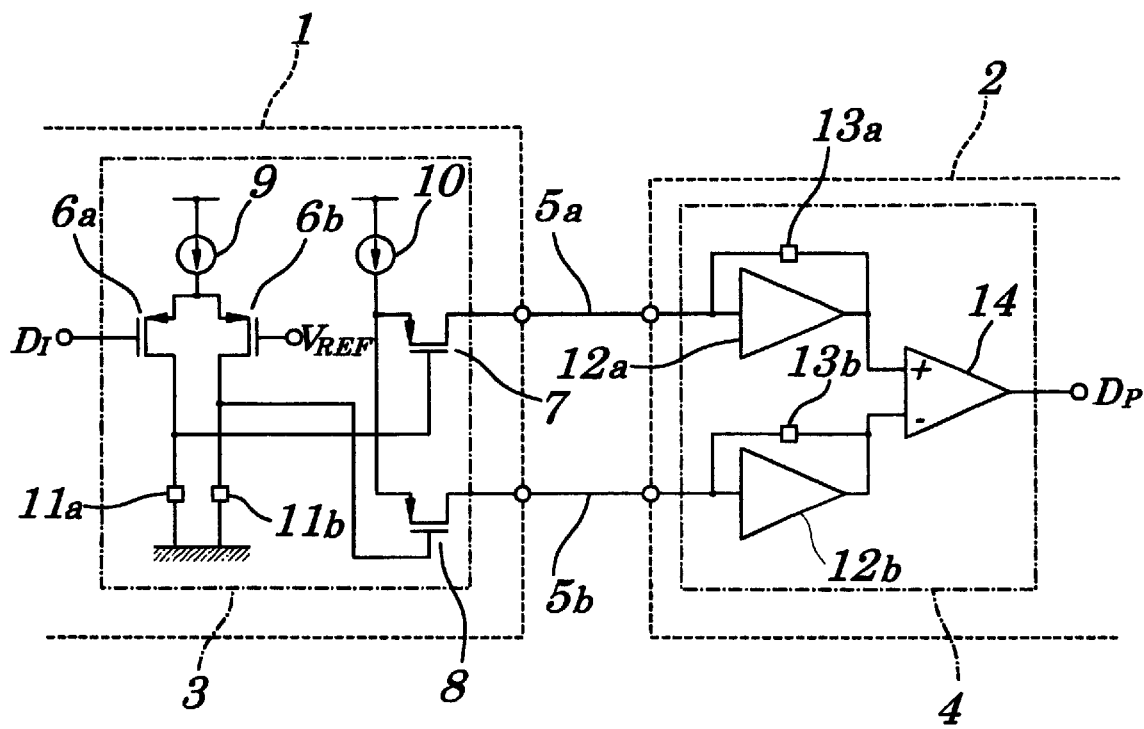
FIG. 11 is a schematic circuit diagram showing electrical configurations of a conventional interface circuit.

When the enable signal EN is at an "H" level, even if the input signal $D_I$ is input to the second input terminal of the NOR gate 72, since output signals from the NOR gates 72 and 73 are always at the "L" level, both the MOS transistors 28 and 29 are turned OFF. Therefore, as shown in FIG. 10, even when m-pieces (m is an integer) of signal sending sections $71_1$ to $71_m$ and n-pieces (n is an integer) of signal receiving sections $24_1$ to $24_n$ are connected in parallel in order to reduce a number of the signal transmission paths, by supplying the enable signal EN being at the "L" level to one signal sending section which transmits signals, for example, to the signal sending section $71_1$ and by supplying the enable signal EN being at the "H" level to (m−1) pieces of signal sending sections which do not transmit signals, for example, signal sending sections $71_2$ to $71_m$, a signal can be transmitted from the signal sending section $71_1$ to n-pieces of signal receiving sections $24_1$ to $24_n$ in parallel, thus allowing the signal transmission path to be constructed to be flexible.

Moreover, even when the signal sending section 71 and the signal receiving section 24 are connected, in a one-to-one relationship, through the signal transmission paths 25a and 25b, by supplying the enable signal EN being at the "H" level to the signal sending section 71 when signals are not transmitted, since the MOS transistors 28 and 29 are all turned OFF and almost no current flows through the signal transmission paths 25a and 25b, power consumption can be reduced.

As described above, since the interface circuit of the present invention is provided with the signal sending section having first and second switching devices adapted to be turned ON alternately in accordance with binary input signal and with the signal receiving section having a first current supplying device adapted to feed current with a predetermined value to a first signal transmission path when the first switching device is ON, a second current supplying device adapted to feed current with a predetermined value to a second signal transmission path when the second switching device is ON and since the signal receiving section is adapted to detect a change in voltages generated depending on availability of current supply at the first and second current supplying devices and to output it in a form of an output signal, signals with high quality can be transmitted at high speed without being affected by the impedance existing in the signal transmission path, mutual interference between the signal transmission paths or external noise. Moreover, power consumption and EMI as well as the number of transmission paths can be reduced. This also allows the signal sending section to be designed freely regardless of number of the signal sending sections. Furthermore, it can provide large versatility and flexibility to changes of conditions occurring after installation of electronic devices. Since it has a very simplified circuit configuration, it does not occupy area when being incorporated into semiconductor circuits.

According to another configuration of the interface circuit of the present invention, it is provided with the signal receiving section having first and second potential holding devices, thus enabling stable transmission of signals, high resistance against external noise and signal receiving at high speed.

According to still another configuration of the interface circuit of the present invention, it is provided with the signal sending section having an output stopping device, thus allowing number of the signal transmission paths to be further reduced and allowing the signal transmission path having more flexibility. Moreover, since almost no current flows through the signal transmission path when signals are not transmitted, additional reduction of power consumption is made possible.

According to still further configurations of the interface circuit of the present invention, since the current supplying device is made of bipolar transistors, signals can be transmitted at high speed and in a stable manner, thus implementing ideal current driving-type interface circuit.

According to still further configurations of the interface circuit of the present invention, the first current supplying device is made of the first and second transistors size of each being one half that of the transistor used for the current supplying device made of only one transistor and each being equal in size and the second current supplying device is made of the third and fourth transistors size of each being one half that of the transistor used for the current supplying device made of only one transistor and each being equal in size, and circuit configurations seen from the connection point between the first current supplying device and the first signal transmission path and those seen from the connection point between the second current supplying device and the second transmission path are symmetric, thus providing symmetric operations and stable and high-speed transmission of signals, and allowing consumed operation currents to be decreased to one half.

According to still further configurations of the interface circuit of the present invention, number of the required signal transmission paths for electronic devices and communication systems can be greatly reduced.

It is apparent that the present invention is not limited to the above embodiments but may be changed and modified without departing from the scope and spirit of the invention. For example, in the above embodiments, though a pattern formed on a printed circuit board is used as the signal transmission paths 25a and 25b, the present invention is not limited to these and such materials as a general line material, twisted paired wire, coaxial cable, flat cable, flexible cable or a like may be used as well.

Moreover, in the above embodiments, semiconductor integrated circuits are used as devices on sender or receiver sides, however, circuits made of discrete electronic parts or a like or electronic circuits made of both semiconductor integrated circuits and discrete electronic parts may be used. That is, the interface circuit of the present invention may be applied not only to an electronic device among internal circuits of which signals are transmitted but also to a communication system among two or more electronic devices of which signals are transmitted.

Furthermore, in the above embodiments, MOS transistors in addition to bipolar transistors are used. However, the present invention is not limited to these transistors. As shown in the fourth embodiment, instead of the MOS transistors 33, 34, 54a, 54b, 55a and 55b forming the signal receiving section, the bipolar transistors may be used for the signal receiving section and further all transistors may be made of bipolar transistors. By constructing the interface circuit with all bipolar transistors, its stability increases more and signal transmission can be sped up more.

Additionally, in the above fifth embodiment, the signal receiving section 24 shown in FIG. 1 is used as the signal receiving section, however, signal receiving sections 41, 51 and 61 shown in FIGS. 5, 6 and 7 respectively may be employed as the signal receiving section.

Finally, the present application claims the Convention Priority based on Japanese Patent application No. Hei 11-229660 filed on Aug. 16, 1999, the disclosures of which are totally incorporated herein by reference.

What is claimed is:

1. An interface circuit comprising:
   a signal sending means having a first switching means and a second switching means which are alternately turned ON in accordance with a binary input signal, said signal sending means located on a first integrated circuit;
   a first transmission path and a second transmission path connecting said first integrated circuit to a second integrated circuit; and
   a signal receiving means located on said second integrated circuit, said signal receiving means having a first current supplying means connected through said first signal transmission path to said first switching means and operated to feed a current with a predetermined value from said first current supplying means through said first signal transmission path when said first switching means is turned ON and a second current supplying means connected through said second transmission path to said second switching means and operated to feed a current with a predetermined value from said second current supplying means through said second transmission path when said second switching means is turned ON,
   whereby said signal receiving means detects a change in voltages generated depending on availability of current supply at said first current supplying means or said second current supplying means and outputs it in the form of a binary output signal, wherein said first current supplying means and said second current supplying means comprise elements of a current mirror of said signal receiving means.

2. The interface circuit according to claim 1, wherein said first switching means is connected between a ground and said first transmission path, said second switching means is connected between said ground and said second transmission path, said first current supplying means is connected between a power source and said first transmission path, and said second current supplying means is connected between said power source and said second transmission path,
   whereby said signal receiving means detects a change in voltages generated depending on availability of current supply at said first current supplying means or said second current supplying means and outputs it in the form of a binary output signal.

3. The interface circuit according to claim 2, wherein said signal receiving means has a first potential holding means for holding a potential at a connection point between said first current supplying means and said first signal transmission path to a predetermined level when said first switching means is turned OFF and a second potential holding means for holding a potential at a connection point between said second current supplying means and said second signal transmission path to a predetermined level when said second switching means is turned OFF.

4. The interface circuit according to claim 2, wherein said signal sending means has an output stopping means to turn OFF both said first switching means and said second switching means.

5. The interface circuit according to claim 3, wherein said first switching means and said second switching means, said first and second current supplying means, and said first potential holding means and said second potential holding means comprise transistors.

6. The interface circuit according to claim 5, wherein at least said first current supplying means and said second current supplying means comprise bipolar transistors.

7. The interface circuit according to claim 3, wherein said signal receiving means further comprises:
   a third current supplying means;
   a fourth current supplying means; and
   an reset-set flip flop,
   wherein said third current supplying means is connected between said power source and said first transmission path, and said fourth current supplying means is connected between said power source and said second transmission path,
   whereby said signal receiving means detects a change in voltages generated depending on availability of current supply at said first current supplying means or said second current supplying means and outputs it in the form of a first binary output signal, and also detects a change in voltages generated depending on availability of current supply at said fourth current supplying means or said third current supplying means and outputs it in the form of a second binary output signal, and said first binary output signal and said second binary output signal are input to said reset-set flip flop.

8. An electronic device having an interface circuit, said interface circuit comprising:
   a signal sending means having a first switching means and a second switching means which are alternately turned ON in accordance with a binary input signal, said signal sending means located on a first integrated circuit;
   a first transmission path and a second transmission path, each interconnecting said first integrated circuit with a second integrated circuit; and a signal receiving means located on said second integrated circuit, said signal receiving means having a first current supplying means connected through said first signal transmission path to said first switching means and operated to feed a current with a predetermined value from said first current supplying means through said first signal transmission path when said first switching means is turned ON and a second current supplying means connected through said second transmission path to said second switching means and operated to feed a current with a predetermined value from said second current supplying means through said second transmission path when said second switching means is turned ON, whereby said signal receiving means detects a change in voltages generated depending on availability of current supply at said first current supplying means or said second current supplying means and outputs it in the form of a binary output signal, wherein said first current supplying means and said second current supplying means comprise elements of a current mirror of said signal receiving means.

9. An electronic circuit comprising:

a circuit having signal sending means having a first switching means and a second switching means which are alternately turned ON in accordance with a binary input signal, said circuit located on a first integrated circuit; and at least one circuit on a second integrated circuit having a signal receiving means having a first current supplying means connected through a first signal transmission path to said first switching means and operated to feed a current with a predetermined value from said first current supplying means through said first signal transmission path when said first switching means is turned ON and a second current supplying means connected through a second transmission path to said second switching means and operated to feed a current with a predetermined value from said second current supply means through said second transmission path when said second switching means is turned ON, wherein said first current supplying means and said second current supplying means comprise elements of a current mirror of said signal receiving means.

10. An electrode device according to claim 9, further comprising:

an output stopping means to turn OFF both said first switching means and said second switching means.

11. A communication system comprising:

an electronic device having signal sending means having a first switching means and a second switching means which are alternately turned ON in accordance with a binary input signal, said first switching means and said second switching means located on a first integrated circuit chip; and at least one electronic device having a signal receiving means located on a second integrated chip, said signal receiving means having a first current supplying means connected through a first signal transmission path to said first switching means and operated to feed a current with a predetermined value from said first current supplying means through said first signal transmission path when said first switching means is turned ON and a second current supplying means connected through a second transmission path to said second switching means and operated to feed a current with a predetermined value from said second current supplying means through said second transmission path when said second switching means is turned ON, wherein said first current supplying means and said second current supplying means comprise elements of a current mirror of said signal receiving means.

12. A communication system according to claim 11, further comprising:

an output stopping means to turn OFF both said switching means and said second switching means.

13. An interface circuit comprising:

a signal sending circuit having a first switching circuit and a second switching circuit which are alternately turned ON in accordance with a binary input signal, said signal sending circuit located on a first integrated circuit;

a first transmission path and a second transmission path connecting said first integrated circuit to a second integrated circuit; and a signal receiving circuit located on said second integrated circuit, said signal receiving circuit having a first current supplying circuit connected through said first signal transmission path to said first switching circuit and operated to feed a current with a predetermined value from said first current supplying circuit through said first signal transmission path when said first switching circuit is turned ON and a second current supplying circuit connected through said second transmission path to said second switching circuit and operated to feed a current with a predetermined value from said second current supplying circuit through said second transmission path when said second switching circuit is turned ON, whereby said signal receiving circuit detects a change in voltages generated depending on availability of current supply at said first current supplying circuit or said second current supplying circuit and outputs it in the form of a binary output signal and wherein said first current supplying circuit and said second current supplying circuit comprise elements of a current mirror of said signal receiving circuit.

14. The interface circuit according to claim 13, wherein said first switching circuit is connected between a ground and said first transmission path, said second switching circuit is connected between said ground and said second transmission path, said first current supplying circuit is connected between a power source and said first transmission path, and said second current supplying circuit is connected between said power source and said second transmission path, whereby said signal receiving circuit detects a change in voltages generated depending on availability of current supply at said first current supplying circuit or said second current supplying circuit and outputs it in the form of a binary output signal.

15. The interface circuit according to claim 14, wherein said signal receiving circuit has a first potential holding circuit for holding a potential at a connection point between said first current supplying circuit and said first signal transmission path to a predetermined level when said first switching circuit is turned OFF and a second potential holding circuit for holding a potential at a connection point between said second current supplying circuit and said second signal transmission path to a predetermined level when said second switching circuit is turned OFF.

16. The interface circuit according to claim 14, wherein said signal sending circuit has an output stopping circuit to turn OFF both said first switching circuit and said second switching circuit.

17. The interface according to claim 15, wherein said first switching circuit, said second switching circuit, said first current supplying circuit, said second current supplying circuit, said first potential holding circuit, and said second potential holding circuit comprise transistors.

18. The interface according to claim 17, wherein at least said first current supplying circuit and said second current supplying circuit comprise bipolar transistors.

19. The interface circuit according to claim 15, wherein said signal receiving circuit further comprises:

a third current supplying circuit;

a fourth current supplying circuit; and a reset-set flip flop, wherein said third current supplying circuit is connected between said power source and said first transmission path, and said forth current supplying circuit is connected between said power source and said second transmission path, whereby said signal receiving circuit detects a change in voltages generated depending on availability of current supply at said first current supplying circuit or said second current supplying circuit and outputs it in the form of a first binary output signal, and also detects a change in voltages generated depending on availability of current supply at said fourth current supplying circuit(or said third current supplying circuit and outputs it in the form of a second binary output signal, and said first binary output signal and said second binary output signal are input to said reset-set flip flop.

* * * * *